US011823735B2

United States Patent
Sawada

(10) Patent No.: US 11,823,735 B2
(45) Date of Patent: Nov. 21, 2023

(54) SEMICONDUCTOR DEVICE

(71) Applicant: RENESAS ELECTRONICS CORPORATION, Tokyo (JP)

(72) Inventor: Yohei Sawada, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 194 days.

(21) Appl. No.: 17/520,020

(22) Filed: Nov. 5, 2021

(65) Prior Publication Data

US 2022/0165332 A1 May 26, 2022

(30) Foreign Application Priority Data

Nov. 24, 2020 (JP) .................................. 2020-194038

(51) Int. Cl.
  *G11C 27/02* (2006.01)
  *G11C 11/419* (2006.01)
  *G11C 11/412* (2006.01)
  *H10B 10/00* (2023.01)

(52) U.S. Cl.
  CPC .......... *G11C 11/419* (2013.01); *G11C 11/412* (2013.01); *H10B 10/12* (2023.02); *H10B 10/18* (2023.02)

(58) Field of Classification Search
  CPC ..... G11C 11/419; G11C 11/412; H01B 10/12; H01B 10/18
  See application file for complete search history.

(56) References Cited

U.S. PATENT DOCUMENTS

| 10,466,739 | B1* | 11/2019 | Heo ...................... G11C 7/1006 |
| 10,897,248 | B2 | 1/2021 | Yokoyama et al. |
| 2010/0296351 | A1* | 11/2010 | Sano .................... G11C 11/4076 327/158 |
| 2019/0379270 | A1* | 12/2019 | Pullen ................... H02M 3/158 |

FOREIGN PATENT DOCUMENTS

JP 2019-169846 A 10/2019

* cited by examiner

Primary Examiner — Min Huang
(74) Attorney, Agent, or Firm — McDermott Will & Emery LLP

(57) ABSTRACT

A semiconductor device includes a main circuit and a peripheral circuit inputting/outputting a signal from/to the main circuit, the main circuit including: a memory cell array; a sense amplifier; a first output holding circuit holding the read data output from the sense amplifier; a second output holding circuit receiving the read data as its input output from the first output holding circuit; and a delay circuit outputting a delay signal for activating the second output holding circuit to be later than the first output holding circuit. The delay circuit includes an element applying a load capacitance to a wiring of the delay signal. A power-supply voltage being a first voltage is supplied to the memory cell array, the sense amplifier and the first output holding circuit. A power-supply voltage being a second voltage is supplied to the delay circuit, the second output holding circuit and the peripheral circuit.

5 Claims, 8 Drawing Sheets

SEMICONDUCTOR DEVICE

CROSS-REFERENCE TO RELATED APPLICATION

The disclosure of Japanese Patent Application No. 2020-194038 filed on Nov. 24, 2020, including the specification, drawings and abstract is incorporated herein by reference in its entirety.

BACKGROUND

The present invention relates to a semiconductor device.
There is disclosed a technique listed below.
[Patent Document 1] Japanese Unexamined Patent Application Publication No. 2019-169846

As a specific example of an SRAM (Static Random Access Memory), the Patent Document 1 discloses a semiconductor device configured to recovery deterioration of BTI (Bias Temperature Instability) of a MOS transistor even at the time of inactivation of an operational mode signal. In an SRAM, a data read from a memory cell array is output to a sense amplifier of an input/output block, and a value of the data is determined by the sense amplifier. The sense amplifier outputs the read data by outputting a voltage corresponding to the determined value.

SUMMARY

In an SRAM, a main circuit (such as an SRAM hard macro) including a memory cell array and a peripheral circuit use different power supplies from each other. Generally, a power-supply voltage being a higher voltage that that of the peripheral circuit is supplied to the SRAM hard macro. In this manner, a voltage and a clock frequency of a processor and others can be appropriately controlled to reduce power consumption.

However, when a power-supply voltage (VDDC) of the SRAM hard macro is higher than a power-supply voltage (VDDP) of the peripheral circuit (VDDP<VDDC), an access time of the SRAM hard macro is too earlier than that of the peripheral circuit. Therefore, a hold buffer for adjusting the timing is embedded into the SRAM hard macro.

On the other hand, when the high-speed operation is desired, the power-supply voltage (VDDC) of the SRAM hard macro and the power-supply voltage (VDDP) of the peripheral circuit are set to the same voltage (VDDC=VDDP). An operational speed in this case is more deteriorated than a case without the hold buffer because the operational speed is limited by the hold buffer.

The present invention has been made in consideration of such matters, and one purpose of the present invention is to provide a semiconductor device capable of adjusting an operational speed in accordance with a relation between a power-supply voltage level of a main circuit including a memory cell array and a power-supply voltage level of a peripheral circuit.

The summary of the typical aspects of the inventions disclosed in the present application will be briefly described as follows. A typical semiconductor device includes a main circuit and a peripheral circuit inputting/outputting a signal from/to the main circuit, the main circuit including: a memory cell array having a plurality of memory cells; a sense amplifier determining a value of a data read from the memory cell array and outputting a determined result as a read data; a first output holding circuit holding the read data output from the sense amplifier; a second output holding circuit connected to an output terminal of the first output holding circuit to receive the read data as its input output from the first output holding circuit; and a delay circuit outputting a delay signal for activating the second output holding circuit to be later than the first output holding circuit. The delay circuit includes an element applying a load capacitance to a wiring of a delay signal. A power-supply voltage being a first voltage is supplied to the memory cell array, the sense amplifier and the first output holding circuit. A power-supply voltage being a second voltage is supplied to the delay circuit, the second output holding circuit and the peripheral circuit.

According to the brief explanation for the effects obtained by the typical aspects of the invention disclosed in the present application, an operational speed can be adjusted in accordance with a relation between a power-supply voltage level of a main circuit including a memory cell array and a power-supply voltage level of a peripheral circuit.

BRIEF DESCRIPTIONS OF THE DRAWINGS

DETAILED DESCRIPTION

Hereinafter, embodiments of the present invention will be described in detail with reference to the accompanying drawings.

Note that the same components are denoted by the same reference symbols in principle throughout all the drawings for describing the embodiments, and the repetitive description thereof will be omitted.

First Embodiment

<Configuration of Semiconductor Device>

Figure 1:
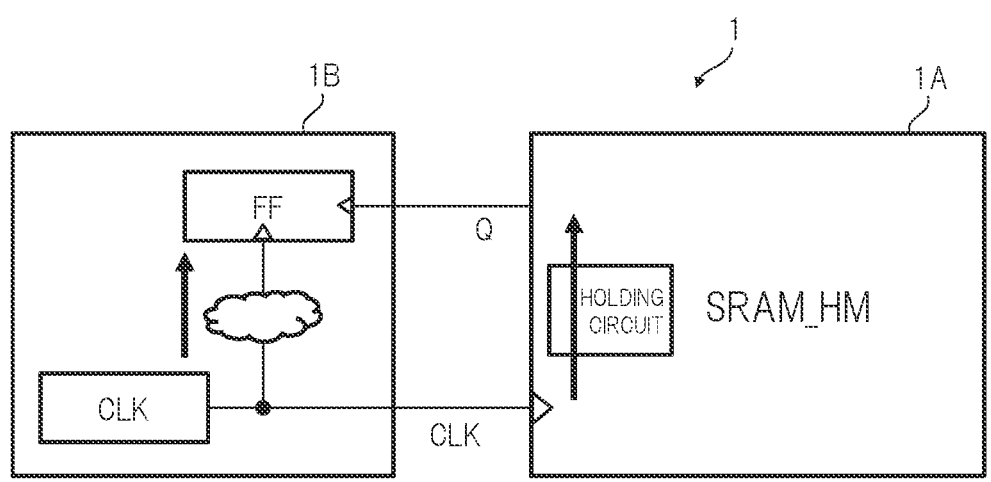
FIG. 1 is a block diagram showing an outline of a semiconductor device according to a first embodiment of the present invention.

FIG. 1 is a block diagram showing an outline of a semiconductor device according to a first embodiment of the present invention. A semiconductor device 1 includes an SRAM hard macro (main circuit) 1A and a peripheral circuit 1B. The SRAM hard macro 1A includes a memory cell array and a circuit related to a reading operation, a writing operation and others. A part of these circuits may be made of, for example, a standard cell. To the SRAM hard macro 1A except for a partial component, a power supply voltage (VDDC) being a high voltage (first voltage) is supplied.

The peripheral circuit 1B is a circuit performing input/output of signals from/to the SRAM hard macro 1A and others. The peripheral circuit 1B is a circuit other than the SRAM hard macro 1A, and includes, for example, a clock generating circuit for generating clocks to be supplied to the SRAM hard macro 1A, a flip flop circuit and others. To the peripheral circuit 1B, a power supply voltage (VDDP) being a low voltage (second voltage) that is lower than that of the SRAM hard macro 1A is supplied. As described above, the semiconductor device 1 is connected to the power supply that supplies the power-supply voltage (VDDC) being the high voltage and the power supply that supplies the power-supply voltage (VDDP) being the low voltage.

Note that the following explanation will be mainly made on the assumption that the first voltage of the power-supply voltage (VDDC) is larger than the second voltage of the power-supply voltage (VDDP) as a matter of convenience. However, when the high-speed operation or others is desired, the first voltage and the second voltage may be set to the same voltage in some cases.

Figure 2:
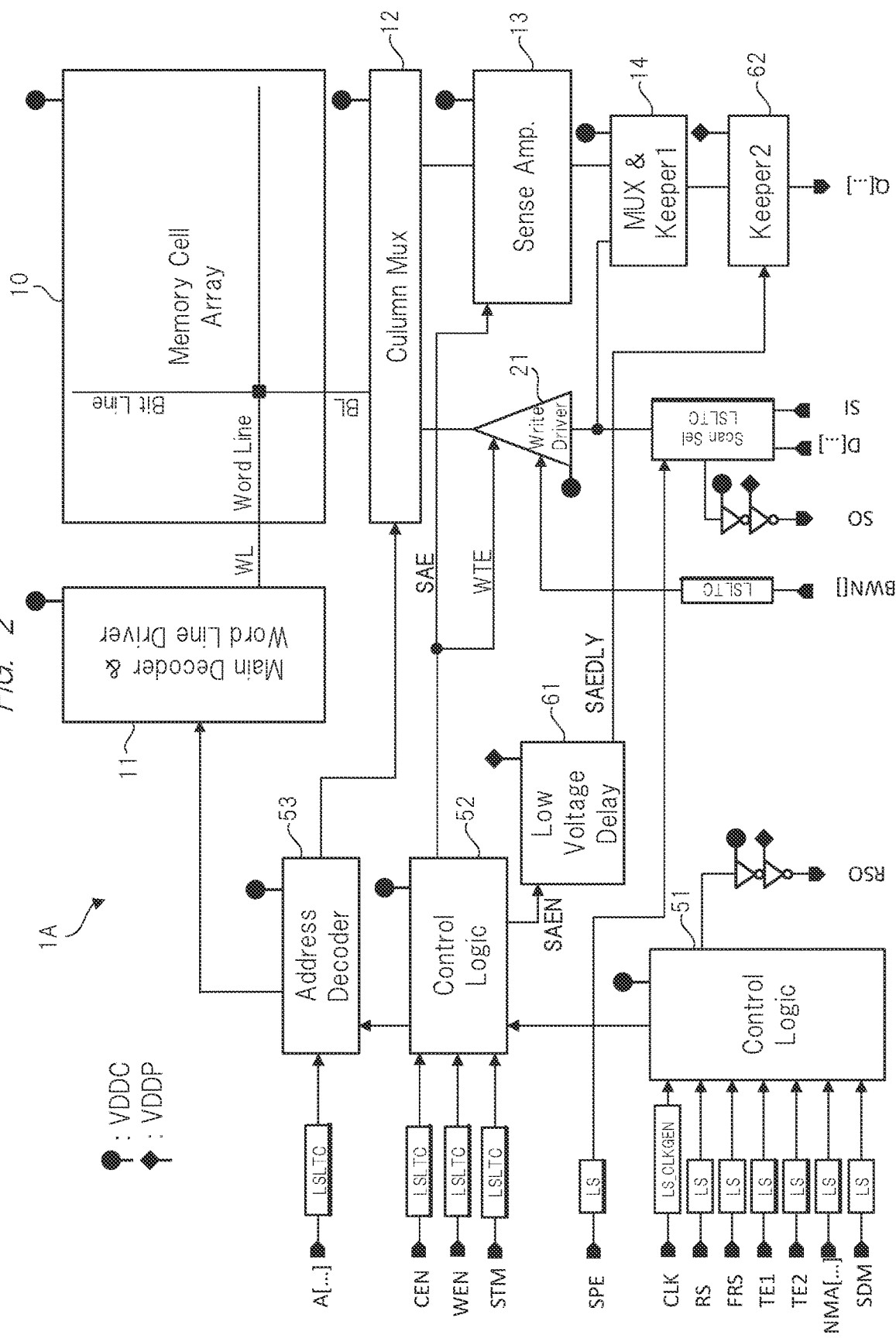
FIG. 2 is a circuit block diagram showing a configurational example of an SRAM hard macro according to the first embodiment of the present invention.

FIG. 2 is a circuit block diagram showing a configurational example of an SRAM hard macro according to the first embodiment of the present invention. As shown in FIG. 2, the SRAM hard macro 1A includes a memory cell array 10, a main decoder 11, a column multiplexer 12, a sense amplifier 13, a first output holding circuit 14, a write driver 21, a first controller 51, a second controller 52, an address decoder 53, a delay circuit 61 and others.

The delay circuit 61 and the second output holding circuit 62 of these components operate at the power-supply voltage (VDDP) being the low voltage. Other components that are the memory cell array 10, the main decoder 11, the column multiplexer 12, the sense amplifier 13, the first output holding circuit 14, the second output holding circuit 62, the write driver 21, the first controller 51, the second controller 52 and the address decoder 53 operate at the power-supply voltage (VDDC) being the high voltage. In the drawings, the power-supply voltage (VDDP) being the low voltage is represented by "◆", and the power-supply voltage (VDDC) being the high voltage is represented by "●" in some cases.

As shown in FIG. 1, the signal that is supplied from the peripheral circuit 1B to the SRAM hard macro 1A is subjected to, for example, voltage-level shift made by a level shifter circuit (LS), a level shifter/clock generating circuit (LS_CLKGEN), a latch circuit with a level shifter (LSLTC) and a scan selector/latch circuit with a level shifter (Scan Sel LSLTC).

In the memory cell array 10, for example, a plurality of SRAMs are arranged in an array form. However, the memory cell may be a different memory such as a DRAM.

The first controller 51 is, for example, a functional block that collectively controls various operations such as the reading operation and the writing operation of the SRAM hard macro 1A and other operations.

The second controller 52 is, for example, a functional block that controls various functional blocks for the reading operation and the writing operation in accordance with instructions from the first controller 51. The second controller 52 is connected to the address decoder 53, and instructs the address decoder 53 to start the reading operation or the writing operation. The address decoder 53 decodes an address signal "A" that is input from the peripheral circuit, and generates a word signal corresponding to the address signal A and a bit signal corresponding to the address signal A. Then, the address decoder 53 outputs the word signal to the main decoder 11, and outputs the bit signal to the column multiplexer 12.

The main decoder 11 selects a word line WL corresponding to the word signal that is supplied from the address decoder 53, and the column multiplexer 12 selects a bit line BL corresponding to the bit signal that is supplied from the address decoder 53. In this manner, a memory cell to be read or written is selected.

The second controller 52 is connected to the write driver 21. The second controller 52 outputs a signal WTE to the write driver 21 at the time of the writing operation to supply a writing data "D" from the write driver 21 to the column multiplexer 12. The writing data is written to the memory cell assigned by the address signal A.

Also, the second controller 52 is connected to the sense amplifier 13. The second controller 52 outputs a signal (first signal) SAE to the sense amplifier 13 at a predetermined timing of the time of the reading operation to activate the sense amplifier 13. In this manner, the data of the memory cell assigned by the address signal A is read out and is supplied to the sense amplifier 13. The sense amplifier 13 determines a value of the data that is read from the memory cell, and outputs the determined value as a reading data.

In a period of the activation of the sense amplifier 13, the first output holding circuit 14 is also activated, and the reading data that is output from the sense amplifier 13 is held by the first output holding circuit 14.

Also, the second controller 52 is connected to the delay circuit 61, and outputs a signal (second signal) SAEN to the delay circuit 61 at a predetermined timing of the time of the reading operation. In this manner, the second controller 52 outputs a signal (delay signal) SAEDLY from the delay circuit 61 to the second output holding circuit 62. The signal SAE and the signal SAEDLY may be output at the same timing, or the signal SAEDLY may be output to be later than the signal SAE.

By the supply of the signal SAEDLY, the second output holding circuit 62 is activated, and the reading data held by the first output holding circuit 14 is supplied to the second output holding circuit 62 and is held. Then, the reading data is output from the second output holding circuit 62.

The timing for the supply of the signal SAEDLY to the second output holding circuit 62 is later than the timing for the supply of the signal SAE to the first output holding circuit 14. In other words, the signal SAEDLY is the signal for activating the second output holding circuit 62 to be later than the first output holding circuit 14.

Note that the first controller 51 and the second controller 52 may be made of different bodies from each other as shown in FIG. 2, or may be made of the same block.

<<Delay Circuit and Second Output Holding Circuit>>

The delay circuit 61 is a circuit for delaying the signal SAEDLY, and includes a lot of elements applying a load capacitance to a wiring for the signal SAEDLY. The wiring for the signal SAEDLY has a large length, and is connected to the lot of elements inside the delay circuit 61. Therefore, the load capacitance on the wiring for the signal SAEDLY is large. Thus, under the low voltage, the delay of the signal SAEDLY is increased by the influence of the load capacitance. Accordingly, in the delay circuit 61, the delay of the signal SAEDLY can be increased by a small number of the logical steps.

Meanwhile, under the high voltage, the influence of the load capacitance is smaller than that under the low voltage.

The number of the logical steps inside the delay circuit 61 is small. Therefore, the delay of the signal SAEDLY under the high voltage is smaller than that under the low voltage, and is almost the same as that of the signal SAE.

Therefore, the second output holding circuit 62 is activated to be later than the first output holding circuit 14 under the low voltage, but is activated at almost the same timing as that of the first output holding circuit 14 under the high voltage. In other words, under the high voltage, the second output holding circuit 62 operates at almost the same speed as that of the first output holding circuit 14.

Note that the low voltage and the high voltage described in the specification are the power-supply voltage levels on the lower voltage side supplied to the delay circuit 61 and the second output holding circuit 62.

However, if the same delay as that of the delay circuit 61 is desired by the standard cell as provided in the related art, a lot of number of the logical steps is necessary because the load capacitance on the wiring is not allowed to be large. Therefore, the delay is not allowed to be small even under the high voltage because of being affected by the influence of the number of the logical steps.

The second output holding circuit 62 is a circuit for adjusting a time lag between access time of the SRAM hard macro 1A and access time of the peripheral circuit 1B. An input terminal of the second output holding circuit 62 is connected to an output terminal of the first output holding circuit 14. To the second output holding circuit 62, the power-supply voltage (VDDP) being the low voltage is supplied. The second output holding circuit 62 to which the signal SAEDLY has been supplied from the delay circuit 61 is activated, and holds the reading data output from the first output holding circuit 14 and outputs the reading data.

In a related-art configuration without the second output holding circuit 62, it is necessary to lengthen an active period of the word line WL in order to match an output timing of the reading data with that of the peripheral circuit 1B. On the other hand, in the present embodiment, since the second output holding circuit 62 is activated to be later than the first output holding circuit 14, the reading data can be held by the second output holding circuit 62, and therefore, the active period of the word line WL can be shorter than that of the related art. In this manner, the power consumption at the time of the reading operation can be reduced.

<<Level Shifter Circuit (LS)>>

Figure 3:
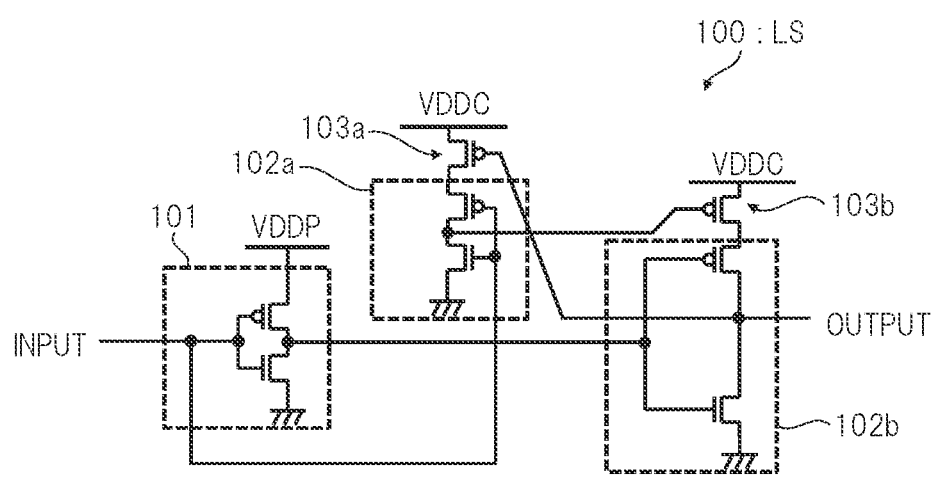
FIG. 3 is a circuit diagram showing an example of a level shifter circuit.

FIG. 3 is a circuit diagram showing one example of the level shifter circuit. Note that FIG. 2 shows the plurality of level shifters (LS). These level shifter circuits (LS) are commonly denoted with a numerical character 100, and a configuration of the level shifter circuit 100 will be explained below.

As shown in FIG. 3, the level shifter circuit 100 includes inverters 101, 102a and 102b, and PMOS 103a and 103b. The inverter 101 is a circuit operating at the power-supply voltage (VDDP) being the low voltage. Meanwhile, each of the inverters 102a and 102b and the PMOS 103a and 103b is a circuit operating at the power-supply voltage (VDDC) being the high voltage. The inverter 101 is a circuit that inverts an input data to adjust a waveform of the input data.

Logical thresholds of the inverters 102a and 102b are set to be low. Therefore, the inverters 102a and 102b can recognize a high level of the power-supply voltage (VDDP) being the low voltage. In the inverters 102a and 102b, a source-drain electric current of an NMOS is larger than a source-drain electric current of a PMOS.

The PMOS 103a and 103b are connected in series to PMOS of the corresponding inverters 102a and 102b, respectively. When the inverters 102a and 102b erroneously recognize that the high level of the power-supply voltage (VDDP) being the low voltage is a low level, the PMOS 103a and 103b prevent the power-supply voltage (VDDC) being the high voltage from being supplied.

An input terminal of the inverter 102a is connected to an input terminal of the inverter 101, and directly receives the input data to be supplied to the level shifter circuit 100 as its input. An output terminal of the inverter 102a is connected to an input terminal of the PMOS 103b. An input terminal of the inverter 102b is connected to an output terminal of the inverter 101. An output terminal of the inverter 102b is connected to an input terminal of the PMOS 103a. An output terminal of the inverter 102b is an output terminal of the level shifter circuit 100.

<<Level Shifter/Clock Generating Circuit (LS_CLK-GEN)>>

FIG. 4 is a circuit diagram showing one example of a level shifter/clock generating circuit. A level shifter/clock generating circuit 200 is a circuit for generating clocks used inside the SRAM hard macro 1A while shifting the level of the input data.

Figure 4A:
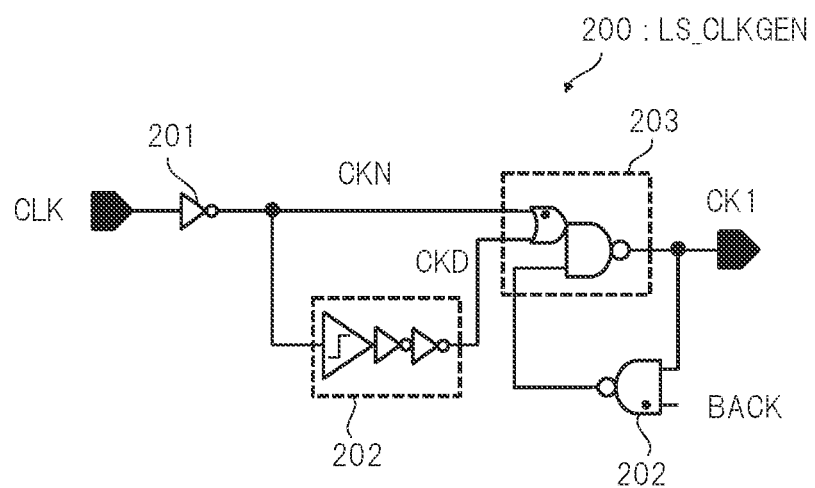
FIG. 4A is a circuit diagram showing an example of a level shifter/clock generating circuit.
Figure 4B:
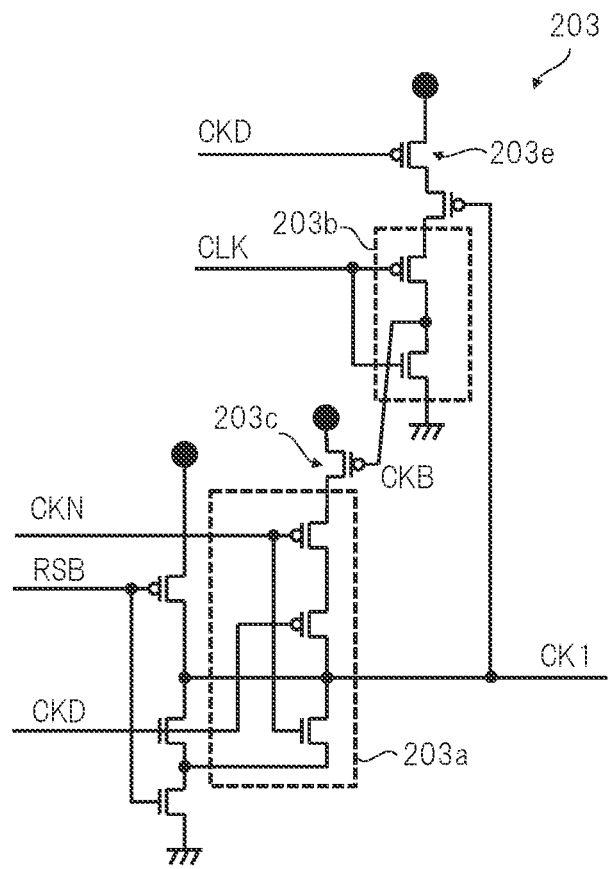
FIG. 4B is a circuit diagram showing an example of a level shifter/clock generating circuit.

FIG. 4A shows a circuit diagram of the level shifter/clock generating circuit 200, and FIG. 4B shows details of a later-described circuit 203.

As shown in FIG. 4A, the level shifter/clock generating circuit 200 includes an inverter 201 and circuits 202 to 204. The inverter 201 is a circuit operating at the power-supply voltage (VDDP) being the low voltage. On the other hand, each of the circuits 202 to 204 is a circuit operating at the power-supply voltage (VDDC) being the high voltage. The inverter 201 is a circuit that inverts the input data to adjust the waveform of the input data. The circuit 202 is a circuit for generating a signal CKD that is formed by delaying the signal CKN.

In the circuit 203, logical thresholds of inverters 203a and 203b shown in FIG. 4B are set to be low. Therefore, the inverters 203a and 203b can recognize a high level of the power-supply voltage (VDDP) being the low voltage. In the inverters 203a and 203b, a source-drain electric current of an NMOS is larger than a source-drain electric current of a PMOS.

PMOS 203c and 203d are connected in series to PMOS of the corresponding inverters 203a and 203b, respectively. When the inverters 203a and 203b erroneously recognize that the high level of the power-supply voltage (VDDP) being the low voltage is a low level, the PMOS 203c and 203d prevent the power-supply voltage (VDDC) being the high voltage from being supplied.

A clock CK1 that is an output of the level shifter/clock generating circuit 200 is an internal clock of the SRAM hard macro 1A, and therefore, and has a shorter pulse width than that of the clock CLK that is an input of the level shifter/clock generating circuit 200 in some cases. In this case, when the clock CLK rises to the high level after the clock CK1 falls to the low level, a leakage current in the inverter 203b increases. A PMOS 203e is arranged to prevent occurrence of the leakage current in this case.

<<Latch Circuit with Level Shifter (LSLTC)>>

Figure 5:
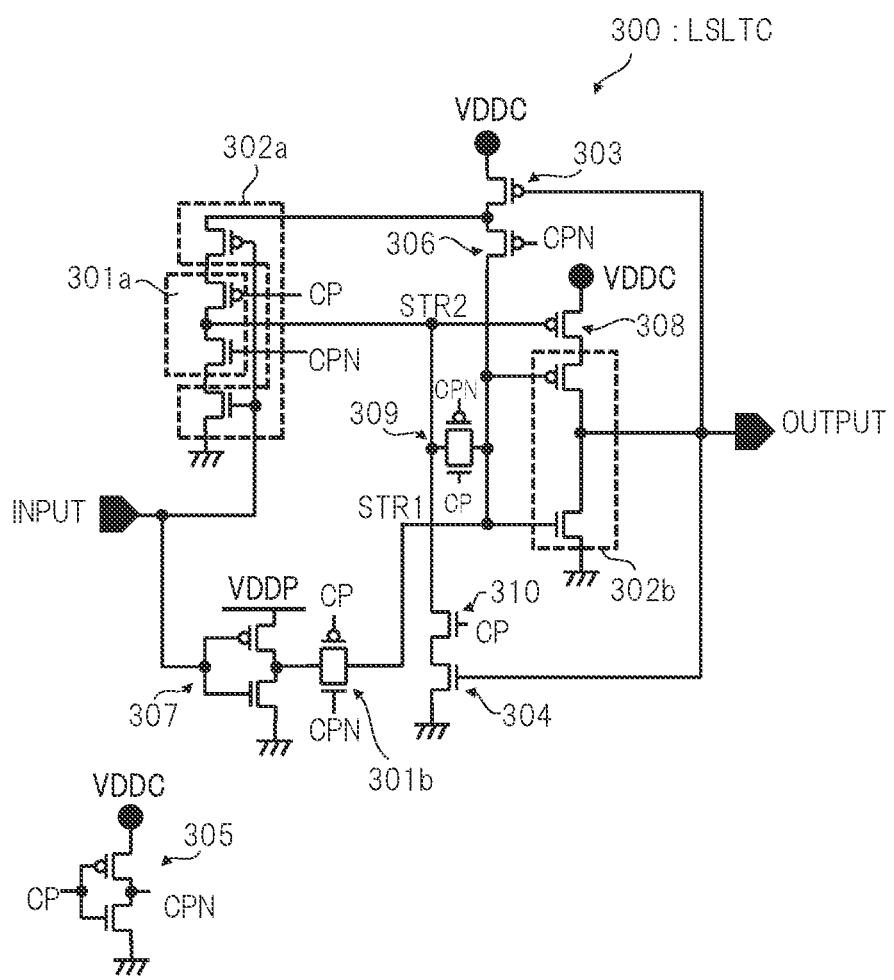
FIG. 5 is a circuit diagram showing an example of a latch circuit with a level shifter.

FIG. 5 is a circuit diagram showing one example of a latch circuit with a level shifter. Note that FIG. 2 shows a plurality of latch circuits with level shifters (LSLTC). In this specification, these latch circuits with level shifters are commonly denoted with a numerical character 300, and a configuration of the latch circuit with the level shifter 300 will be explained.

As shown in FIG. 5, the latch circuit with the level shifter 300 includes circuits 301a and 301b, inverters 302a and 302b, a PMOS 303, an NMOS 304, a latch control circuit 305, a PMOS 306, an inverter 307, a PMOS 308, a latch circuit 309 and an NMOS 310. The circuits 301a and 301b are switch circuits for data closure.

The inverter 302a is an inverter for input, and the inverter 302b is an inverter for input. Logical thresholds of the inverters 302a and 302b are set to be low. Therefore, the inverters 302a and 302b can recognize a high level of the power-supply voltage (VDDP) being the low voltage. In the inverters 302a and 302b, a source-drain electric current of an NMOS is larger than a source-drain electric current of a PMOS.

The PMOS 303 is a circuit arranged for feeding back, for example, a "0" data. The NMOS 304 is a circuit arranged for feeding back, for example, a "1" data.

The latch control circuit 305 is a circuit for generating a latch control signal operating the latch circuit with the level shifter 300. The PMOS 306 and the NMOS 310 are switch circuits for the feedback. The inverter 307 is a circuit for the input-data inversion. The latch circuit 309 is a circuit for fixing the data in the latch.

When the inverter 302a erroneously recognizes that the high level of power-supply voltage (VDDP) being the low voltage is a low level, the PMOS 308 prevents the power-supply voltage (VDDC) being the high voltage from being supplied to the inverter 302b.

<<Scan Selector/Latch Circuit with Level Shifter (Scan-Sel LSLTC)>>

Figure 6:
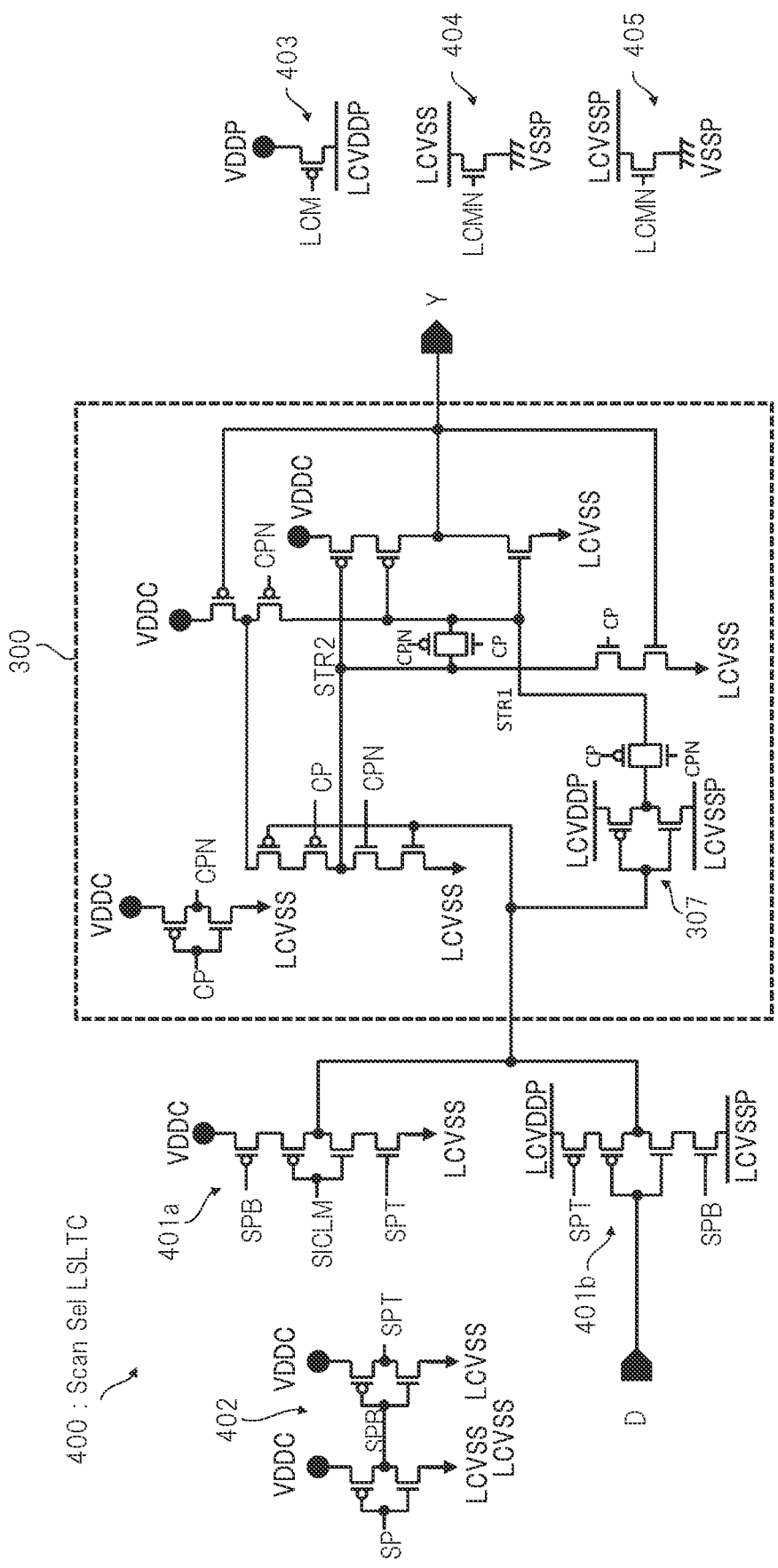
FIG. 6 is a circuit diagram showing an example of a scan selector/latch circuit with a level shifter.

FIG. 6 is a circuit diagram showing one example of a scan selector/latch circuit with a level shifter.

As shown in FIG. 6, a scan selector/latch circuit with a level shifter 400 has a configuration including circuits 401a, 401b and 402 to 405 added to the configuration of the latch circuit with the level shifter 300 of FIG. 5. The circuits 401a, 401b and 402 to 405 configure a scan selector circuit. Outputs of the circuits 401a and 401b are input to the latch circuit with the level shifter 300.

The circuit 403 is a circuit (such as a PMOS) for generating a power-supply voltage (LCVCCP) formed by dropping the power-supply voltage (VDDP) being the low voltage. The power-supply voltage (LCVCCP) formed in the circuit 403 is supplied to the circuit 401 and the inverter 307.

The circuit 404 is a circuit (such as an NMOS) for generating a power-supply voltage (LCVSS) formed by rising the power-supply voltage (VSS). The power-supply voltage (LCVSS) formed in the circuit 404 is supplied to the circuits 401a and 402, the inverters 302a and 302b and the NMOS 304.

The circuit 404 is a circuit (such as an NMOS) for generating a power-supply voltage (LCVSSP) formed by rising the power-supply voltage (VSS). The power-supply voltage (LCVSSP) formed in the circuit 404 is supplied to the circuits 401b and 307.

In the scan selector/latch circuit with the level shifter 400, each of the circuits 402 to 405 and the latch control circuit 305 is made of an LVT (Low Threshold Voltage) element having a lower threshold than a regular one. Each circuit other than these components is made of an SLVT (Low Threshold Voltage) element having a lower threshold than that of the LVT element.

<Main Effects of Present Embodiment>

FIG. 7 is a timing chart for explaining effects of an embodiment of the present invention. FIG. 7 shows an operation in a case in which the power-supply voltage (VDDC) is higher than the power-supply voltage (VDDP) (VDDC>VDDP). In other words, in the example of FIG. 7, it is necessary to adjust the timing for the output of the reading data to match that of the peripheral circuit 1B, the operation (access time) of which is late.

Figure 7A:
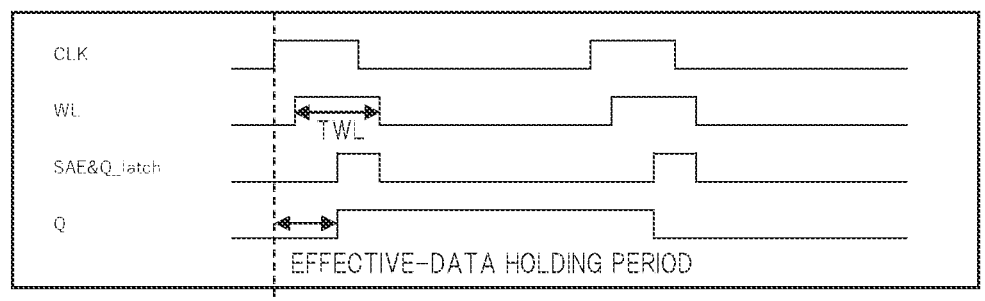
FIG. 7A is a timing chart for explaining effects according to an embodiment of the present invention.
Figure 7B:
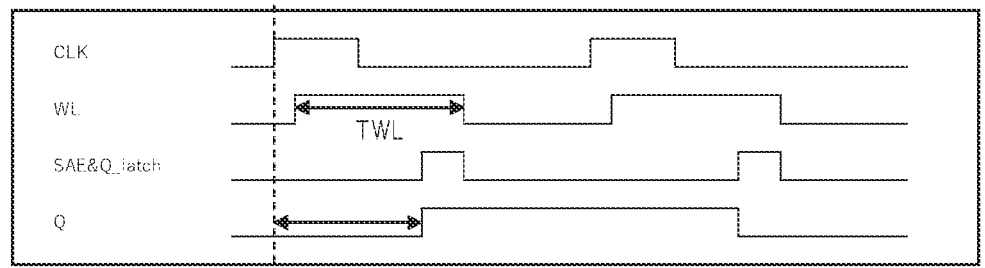
FIG. 7B is a timing chart for explaining effects according to an embodiment of the present invention.
Figure 7C:
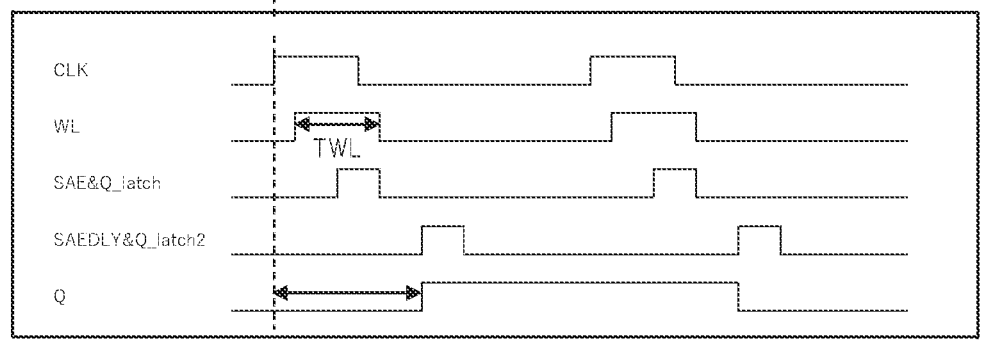
FIG. 7C is a timing chart for explaining effects according to an embodiment of the present invention.

FIG. 7 shows comparison between an operation in the configuration of the present embodiment and an operation in the related-art configuration. FIG. 7A shows the operation in the related-art configuration without the delay circuit and the second output holding circuit 62. FIG. 7B shows an operation in a case of the delay of the signal SAE in the related-art configuration without the delay circuit and the second output holding circuit 62. FIG. 7C shows the operation in the configuration of the present embodiment.

In the case of the delay of the signal SAE as shown in FIG. 7B, the sense amplifier is activated, and therefore, it is necessary to assert a selection signal of the word line WL until the output holding circuit holds the reading data.

Therefore, it is possible to make the clock CLK and an output reading data "Q" dependent on the power-supply voltage (VDDP). However, an assertion period TWL of the word line WL becomes long, and therefore, the power consumption becomes large.

On the other hand, in the configuration of the present embodiment as shown in FIG. 7C, the second output holding circuit 62 that has been activated to be late by the signal SAEDLY can receive and output the reading data held in the first output holding circuit 14 in accordance with the operation of the peripheral circuit 1B.

Therefore, the present embodiment can make the clock CLK and the output reading data "Q" dependent on the power-supply voltage (VDDP), and besides, significantly shorten the assertion period TWL of the word line WL to be shorter than the related-art one.

FIG. 8 is a timing chart for explaining effects according to an embodiment of the present invention. FIG. 8 shows a case of the high-speed operation in a case in which the voltages of the power-supply voltage (VDDC) and the power-supply voltage (VDDP) are the same as each other (VDDC=VDDP). In other words, in the example of FIG. 8, it is unnecessary to adjust the timing for the output of the reading data to match that of the peripheral circuit 1B, the operation (access time) of which is late.

Figure 8A:
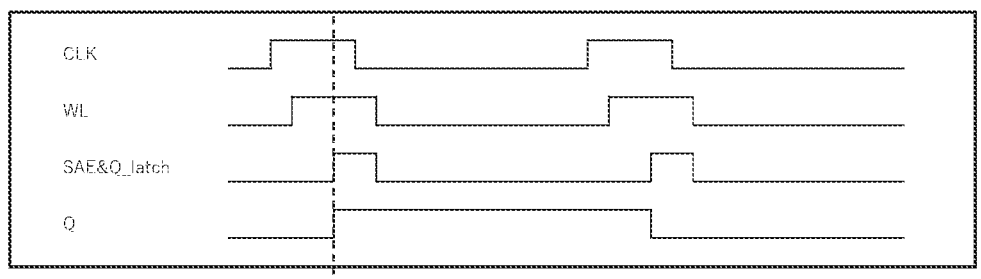
FIG. 8A is a timing chart for explaining effects according to an embodiment of the present invention.

FIG. 8 shows comparison between the operation in the configuration of the present embodiment and the operation in the related-art configuration. FIG. 8A shows the operation in the related-art configuration without the delay circuit and the second output holding circuit 62. In the high-speed operation of the related-art configuration, the reading data Q is output almost simultaneously with when the sense amplifier is activated by the signal SAE.

Figure 8B:
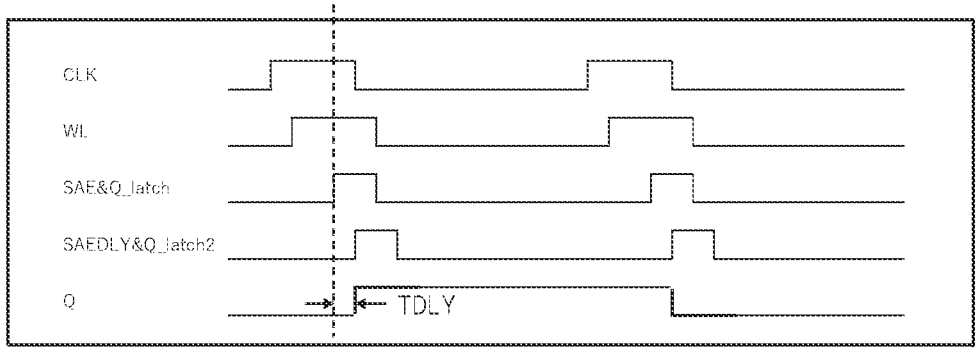
FIG. 8B is a timing chart for explaining effects according to an embodiment of the present invention.

On the other hand, in the configuration of the present embodiment as shown in FIG. 8B, the second output holding circuit 62 is activated to be late by the signal SAEDLY, and the reading data Q is output. However, the timing for the activation of the second output holding circuit 62 is slightly later (TDLY) than that of the first output holding circuit 14. A main cause of this delay is the number of the logical steps inside the delay circuit 61, and the influence of the load capacitance is smaller than that of the number of the logical steps. The high-speed operation can be sufficiently handled if the degree of the delay is as described above.

As described above, according to the present embodiment, the operational speed can be adjusted in accordance with the relation between the power-supply voltage level of the SRAM hard macro 1A and the power-supply voltage level of the peripheral circuit.

Also, according to the present embodiment, the second controller 52 simultaneously outputs the signal SAE and the signal SAEN. According to this technique, it is unnecessary to adjust the timing for the output of the signal SAE and the timing for the output of the signal SAEN, and therefore, the load on the second controller 52 can be reduced.

In the foregoing, the invention made by the present inventors has been concretely described on the basis of the embodiments. However, it is needless to say that the present invention is not limited to the foregoing embodiments, and various modifications and alterations can be made within the scope of the present invention.

What is claimed is:

1. A semiconductor device comprising:
   a main circuit; and
   a peripheral circuit inputting/outputting a signal from/to the main circuit,
   the main circuit including:
   a memory cell array having a plurality of memory cells;
   a sense amplifier determining a value of a data read from the memory cell array and outputting a determined result as a read data;
   a first output holding circuit holding the read data output from the sense amplifier;
   a second output holding circuit connected to an output terminal of the first output holding circuit to receive the read data as its input output from the first output holding circuit; and
   a delay circuit outputting a delay signal for activating the second output holding circuit to be later than the first output holding circuit,
   wherein the delay circuit includes an element applying a load capacitance to a wiring of the delay signal,
   a power-supply voltage being a first voltage is supplied to the memory cell array, the sense amplifier and the first output holding circuit, and
   a power-supply voltage being a second voltage is supplied to the delay circuit, the second output holding circuit and the peripheral circuit.

2. The semiconductor device according to claim 1, wherein the first voltage and the second voltage are equal to each other.

3. The semiconductor device according to claim 1, wherein the first voltage is higher than the second voltage.

4. The semiconductor device according to claim 1, wherein the main circuit includes a controller outputting a first signal for activating the sense amplifier and a second signal for outputting the delay signal to the delay circuit.

5. The semiconductor device according to claim 1, wherein the memory cell is an SRAM.

* * * * *